United States Patent [19]
Medendorp

[11] Patent Number: 5,222,104
[45] Date of Patent: Jun. 22, 1993

[54] GAIN CONTROL CIRCUIT FOR RADIO TRANSMITTER

[75] Inventor: Dale F. Medendorp, Crystal Lake, Ill.

[73] Assignee: Motorola, Inc., Schaumburg, Ill.

[21] Appl. No.: 814,570

[22] Filed: Dec. 30, 1991

[51] Int. Cl.[5] .......................................... H04L 25/49
[52] U.S. Cl. ....................................... 375/67; 375/60;
332/103; 332/155
[58] Field of Search ............... 375/60, 67, 71, 98;
332/103, 106, 107, 144, 145, 155, 159

[56] References Cited

U.S. PATENT DOCUMENTS

| | | | |
|---|---|---|---|
| 3,900,823 | 8/1975 | Sokal et al. | 332/159 |
| 4,199,723 | 4/1980 | Cummings et al. | 332/155 |
| 4,286,236 | 8/1981 | Fischer | 332/106 |
| 4,592,073 | 5/1986 | Watanabe | 375/60 |
| 4,706,262 | 11/1987 | Ohta | 375/60 |

*Primary Examiner*—Curtis Kuntz
*Assistant Examiner*—Don N. Vo
*Attorney, Agent, or Firm*—Robert H. Kelly

[57] ABSTRACT

A gain control circuit for a radio transmitter, such as the radio transmitter portion of a radiotelephone operative to transmit a $\pi/4$ DQPSK-modulated signal in discrete bursts. The signal portion of the signal transmitted during each discrete burst forms a slot and at least one of the slots includes a pre-determined data sequence portion. The peak power level of the portion of the slot comprising the pre-determined data sequence portion, once amplified by amplifier circuitry of the radiotelephone, is compared with a stored value representative of the peak power level of a corresponding portion of a slot amplified to be of a desired signal level. Responsive to such comparison, the amplification level of the amplifier circuitry is altered.

20 Claims, 4 Drawing Sheets

GAIN CONTROL CIRCUIT FOR RADIO TRANSMITTER

BACKGROUND OF THE INVENTION

The present invention relates generally to gain control circuitry for radio transmitters, and, more particularly, to a gain control circuit for a radio transmitter operative to transmit modulated signals in discrete bursts.

A communication system is operative to transmit information (referred to hereinbelow as an "information signal") between two or more locations, and includes, at a minimum, a transmitter and a receiver interconnected by a communication channel. A radio communication system is a communication system in which the transmission channel comprises a radio-frequency channel wherein the radio-frequency channel is defined by a range of frequencies of the communication spectrum.

The transmitter, which forms a portion of a radio communication system, includes circuitry for converting the information signal into a form suitable for transmission thereof upon a radio-frequency channel. Such circuitry includes modulation circuitry which performs a process referred to as modulation. In such a process, the information signal which is to be transmitted is impressed upon a radio-frequency electromagnetic wave.

The radio-frequency electromagnetic wave upon which the information signal is impressed is of a frequency within a range of frequencies defining in the radio-frequency channel upon which the information is to be transmitted. The radio-frequency, electromagnetic wave is commonly referred to as a "carrier signal," and the radio-frequency, electromagnetic wave, once modulated by the information signal, is commonly referred to as a modulated signal.

Various modulation schemes are known for impressing the information signal upon the carrier signal to form thereby the modulated signal. For instance, amplitude modulation, frequency modulation, phase modulation, and combinations thereof are all modulation schemes by which an information signal may be impressed upon a carrier wave to form a modulated signal.

Radio communication systems are advantageous in that no physical interconnection is required between the transmitter and the receiver; once the information signal is modulated to form a modulated signal, the modulated signal may be transmitted over large distances.

A two-way, radio communication system is a radio communication system, similar to the radio communication system described above, but which further permits both transmission of information to a location and transmission of information from that location. Each location of such a two-way, radio communication system contains both a transmitter and a receiver. The transmitter and receiver positioned at a single location typically comprise a unit referred to as a radio transceiver, or, more simply, a transceiver.

Conventionally, transceivers constructed to be operated in two-way communication systems are operative to transmit a modulated signal upon a first radio frequency channel and to receive a modulated signal transmitted upon a second, frequency channel. Because signals transmitted to and by such transceivers are transmitted upon different radio frequency channels, simultaneous two-way communication between two or more transceivers is permitted. Signals are continuously transmitted upon each of the two radio frequency channels to effectuate the two-way communication. Such two-way communication is oftentimes referred to generally by the term duplex operation of the transceiver.

Certain frequency bands of the electromagnetic frequency spectrum have been allocated for such two-way communication. For instance, a frequency band extending between 800 MHz and 900 MHz has been allocated in the United States for cellular communication systems. A plurality of radio frequency channels have been defined in such frequency band permitting operation of numerous cellular telephones (which constitute a type of transceiver construction) thereon. Conventionally, transceivers operative in cellular, communication systems generate modulated signals by a frequency modulation technique. Another frequency band has been allocated for communication by cordless telephones (which constitute another type of radio transceiver construction).

Increased popularity of use of such two-way communication systems has resulted in increased demand for access to the finite number of radio frequency channels allocated for such two-way communication. Schemes have been developed to utilize more efficiently the frequency bands allocated for such use.

Several of such schemes involve the modulating in encoded form the information signal. In such a process, the signal becomes compacted, and the signal may be transmitted more efficiently (i.e., the same amount of information may be transmitted in a lesser amount of time). Additionally, a modulated signal formed by such a process need not be transmitted continuously; rather, the modulated signal may be transmitted in discrete bursts.

To optimize the use of the available frequency spectrum, it is often advantageous to modulate both the phase and amplitude of a signal. One such scheme by which an information signal may be encoded is a $\pi/4$ shifted quarternary phase shift keying ($\pi/4$-QPSK) modulation scheme. In such a modulation scheme, the information content of a modulated signal formed thereby is contained in the phase of the modulated signal. However, rapid phase changes at the data rates used in these communications systems results in large frequency deviations of the modulated signal which, in turn, results in wide frequency channels. To improve spectrum efficiency, the baseband modulation is frequency limited (filtered). This filtering results in significant amplitude modulation of the modulated signal.

A $\pi/4$-QPSK-modulated signal may be transmitted in discrete bursts. By transmitting the modulated signal in discrete bursts, transmission of more than one signal at the same frequency is permitted. Such a technique is referred to as time-division multiple access (TDMA).

However, as the bandwidth is controlled by the amplitude of a $\pi/4$-QPSK-modulated signal, care must be exercised when amplifying such a signal. Amplifier circuitry forms a portion of radio transmitter circuits to amplify a modulated signal prior to transmission thereof.

Gain control circuitry forms a portion of many radio transmitter circuits. Such circuitry controls the signal level of the modulated signal transmitted by the radio transmitter circuit, and typically includes amplifier circuitry for amplifying a modulated signal applied thereto. By controlling the level of amplification of the amplifier circuitry (i.e., by controlling the gain of the amplifier circuitry), the signal level of the amplified, modulated signal transmitted by the radio transmitter may be controlled.

Gain control circuitry may be constructed to determine the average power of a $\pi/4$-QPSK-modulated signal, and the amount of amplification of such a modulated signal may be controlled responsive to such measurement of average power. However, due to the amplitude modulation component, measurement of the average power requires measurement of the signal level of the modulated signal for a period of time. Such a required time period prior to a determination of the appropriate amount of gain of the modulated signal prevents an accurate determination of desired gain of the modulated signal until the required time period has elapsed and the desired gain has been determined.

When utilizing such conventional gain control circuitry in a radio transmitter operative to transmit an amplitude modulated signal in discrete bursts, the appropriate level of amplification of the amplifier circuitry can not be determined within the time period corresponding to the initial discrete burst in which the modulated signal is transmitted.

Alternatively, while the desired level of gain may be initially estimated, such estimation may be inaccurate as such an estimation of desired gain is based upon estimated, and not actual, parameters.

What is needed, therefore, is a gain control circuit operative to determined quickly the desired amount of gain of a modulated signal.

SUMMARY OF THE INVENTION

The present invention, accordingly, advantageously provides a gain control circuit for controlling the levels of gain of amplifier circuitry of a radio transmitter.

The present invention further advantageously provides a gain control circuit for a radio transmitter which generates an amplitude modulated signal in discrete bursts.

The present invention still further advantageously provides a method for controlling the level of gain of amplifier circuitry of a radio transmitter.

The present invention provides further advantages and features, the details of which will become more apparent by reading the detailed description of the preferred embodiments hereinbelow.

In accordance with the present invention, therefore, a gain control circuit for a radio transmitter is disclosed. The radio transmitter is operative to generate an information signal in discrete bursts wherein the information signal generated during at least one of the discrete bursts includes a pre-determined sequence of data, and the variable gain amplifier circuit forming a portion of the transmitter circuitry of the radio transmitter is operative to form an amplified signal in discrete bursts corresponding to the discrete bursts in which the information signal is generated. The values of the magnitude of the amplified signal are measured, and a signal representative of the measured values is generated. The times when the amplified signal formed by the variable gain amplifier circuit comprises the pre-determined sequence of data are detected. The envelope characteristics of the amplified signal are determined at least during times when the amplified signal formed by the variable gain amplifier comprises the pre-determine sequence of data. The gain characteristics of the variable gain amplifier are altered responsive to determine values of the envelope characteristics of the amplified signal.

BRIEF DESCRIPTION OF THE DRAWINGS

The present invention will be better understood when read in light of the accompanying drawings in which.

DESCRIPTION OF THE PREFERRED EMBODIMENTS

In a conventional radio transmitter, a modulated signal is generated by a continuous-wave modulation technique, and the modulated signal is transmitted continuously to transmit the modulated signal upon a transmission channel. In a conventional radio transceiver, comprised of both a radio transmitter portion and a radio receiver portion, a modulated signal is similarly generated by a continuous-wave modulation technique and transmitted continuously. A modulated signal transmitted to the radio transceiver, and received by the radio receiver portion thereof, similarly is transmitted continuously upon a transmission channel. As both the modulated signal transmitted by, and received by, a conventional radio transceiver are continuously transmitted, two transmission channels must be allocated to permit two-way communication with a conventional radio transceiver.

As mentioned hereinabove, use of radio transceivers, such as cellular telephones, to communicate upon a radio communication system has increased dramatically in recent years. Existing frequency bands allocated for such use have, at times, been utilized at full capacity, thereby limiting further increases in usage of such radio communication systems. Accordingly, as also mentioned hereinabove, schemes have developed which permit more efficient utilization of the existing frequency bands allocated for such use. In particular, modulation schemes have been developed to encode and modulate an information signal thereby to permit the modulated signal to be transmitted upon a transmission channel in discrete bursts. Two or more radio transmitters constructed to transmit modulated signals in such discrete bursts may transmit modulated signals upon a single transmission channel as long as the modulated signal generated by respective ones of the radio transmitters do not overlap in time. In such manner, the transmission capacity of existing, allocated frequency bands may be increased.

Figure 1:
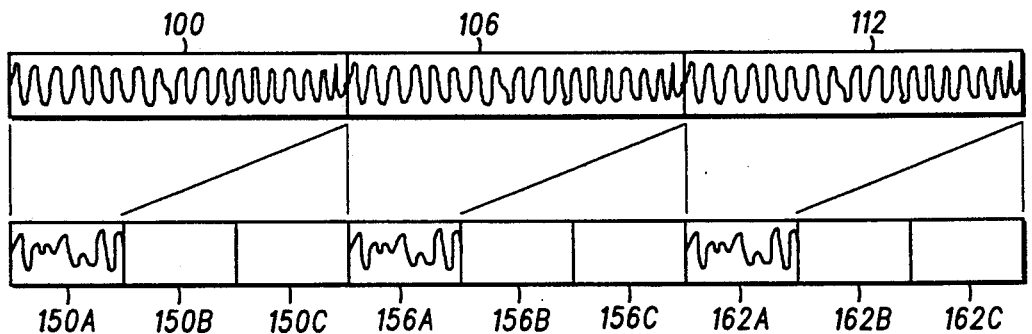
FIG. 1 is a schematic representation illustrating the relationship between a modulated signal generated by a conventional, continuous-wave modulation technique and a modulated signal generated by a modulation technique permitting transmission of the modulated signal in discrete bursts.

Referring first now to the schematic illustration of FIG. 1, the relationship between a modulated signal generated by a conventional, continuous-wave modulation technique (and, here, in particular, a frequency modulation technique), and a modulated signal formed in a manner permitting transmission thereof in discrete bursts is shown. The top portion of FIG. 1 shows tandemly-positioned blocks 100, 106, and 112. Pictured within blocks 100, 106, and 112 is a waveform generated by a conventional, continuous-wave modulation technique, here a frequency-modulation technique. A conventional radio transmitter constructed to generate and to transmit such a modulated signal transmits the modulated signal continuously during transmission thereof. As the signal is transmitted continuously, a single transmission channel must be allocated to permit the continuous transmission of the modulated signal. (A modulated signal generated by a conventional, continuous-wave, modulation technique to be received by the receiver portion of a conventional radio transceiver may be similarly shown.)

FIG. 1 illustrates a three-to-one compaction ratio wherein the information content of the waveforms pictured within blocks 100, 106, and 112 are mapped into block portions 150A, 156A, and 162A, respectively. The waveforms pictured within block portions 150A, 156A, and 162A are representative of transmission of a modulated signal in discrete bursts as the information content of the waveforms pictured within blocks 100, 106, and 112, once encoded, may be transmitted in the discrete bursts represented by the waveforms pictured within block portions 150A, 156A, and 162A.

While no waveforms are pictured within block portions 150B, 150C, 156B, 156C, 162B, and 162C, such block portions represent time periods during which other signals may be transmitted in discrete bursts.

When a radio transmitter is operative to transmit a modulated signal in discrete bursts, timing and synchronization considerations are significant. Modulated signals transmitted upon a single transmission channel cannot be transmitted simultaneously without interfering with one another. Also, a radio receiver operative to receive a modulated signal in discrete bursts must be provided information to permit a determination to be made as to which signals received by the receiver in the discrete bursts are to be demodulated by the receiver and which signals received by the receiver are to be ignored.

Accordingly, when encoding an information signal into compacted form, synchronization information is also introduced into the encoded signal. Such synchronization information may, for example, comprise a pre-determined data sequence. A modulated signal generated and transmitted by a radio transmitter in the discrete bursts is received by a receiver, and the synchronization information forming a portion of one or more of the modulated signal portions transmitted in the discrete bursts is utilized by the radio receiver for synchronization and timing purposes.

Figure 2:
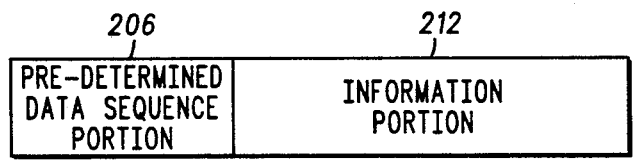
FIG. 2 is a schematic representation of a slot forming a portion of a modulated signal.

Turning now to the schematic representation of FIG. 2, the format of a modulated signal transmitted during a time period corresponding to a single, discrete burst, sometimes referred to as a "slot", and here referred to generally by reference numeral 200, is shown. Slot 200 is representative of a modulated signal generated during a time period represented by block portions 150A, 156A, or 162A of FIG. 1. As illustrated, slot 200 is comprised of a pre-determined data sequence portion 206 and an information portion 212. Pre-determined data sequence portion 206 is represented at a left-hand side of slot 200 to indicate typical positioning thereof at a "front end" of the slot. Pre-determined data sequence portion 206 may be comprised of different types of data depending upon system standards of the particular system in which the signal is transmitted. For instance, when slot 200 comprises the modulated signal portion forming the initial signal portion of a transmitted signal (such as the modulated signal portion positioned within block portion 150A of FIG. 1), the characteristics and length of data sequence portion 206 may differ with that of a slot forming another signal portion of the transmitted signal (such as the modulated signal portion positioned within block portions 156A or 162A of FIG. 1).

Figure 3A:
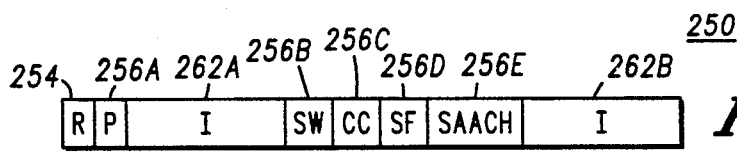
FIGS. 3A and 3B are schematic representations, similar to that of FIG. 2, but illustrating slots formatted according to the formats of particular communication systems.

FIG. 3A is a schematic representation, similar with that of FIG. 2, of the format of a slot, here referred to generally by reference numeral 250, comprising a portion of a modulated signal. Slot 250, however, illustrates the format of a particular communication system, here, in particular, a cellular, communication system described in greater detail in Japan Digital Cellular Standard, RCR STD-27. Slot 250 is shown to be comprised of an initial block 254, pre-determined data sequence portions 256A, 256B, 256C, 256D, and 256E, and information portions 262A and 262B. Initial period 254 is typically referred to as a "ramp" period (represented by the letter "R") during which the information content of the modulated signal portion 250 is ignored. Pre-determined data sequence portion 256A represents a "preamble" segment (represented by the letter "P"); pre-determined data sequence portion 256B represents a "synchronization word" segment (represented by the letters "SW"); pre-determined data sequence portion 256C represents a "color code" segment (represented by the letters "CC"); pre-determined data sequence portion 256D represents a "steal flag" segment (represented by the letters "SF"); and pre-determined data sequence portion 256E represents a "slow associated control channel" segment (represented by the letters "SAACH"). Information portion segments 262A and 262B contain the information content of the information signal which is encoded to form a portion of modulated signal portion 250. Information portion segments 262A and 262B correspond to information portion 212 of modulated signal portion 200 of FIG. 2.

Figure 3B:
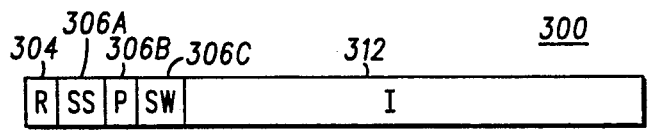

FIG. 3B is a schematic representation, similar with that of FIG. 3A, of the format of a slot, here referred to generally by reference numeral 300, comprising a portion of a modulated signal. Slot 300 of FIG. 3B illustrates the format of another particular communication system, namely, the format of a slot of a modulated signal generated in a digital, cellular, communication system for a Personal Communication Network discussed in greater detail in Japan Digital Cordless Standard, RCR STD-28.

Modulated signal portion 300 is shown to be comprised of an initial block 304, pre-determined data sequence portion segments 306A, 306B, and 306C, and information portion segment 312.

Initial period 304, similar to initial period 254 of modulated signal portion 250 of FIG. 3A, is typically referred to as a "ramp" period (represented by the letter "R") during which the information content of the modulated signal portion 300 is ignored.

Pre-determined data sequence portion segment 306A represents a "start symbol" segment (represented by the letters "SS"); pre-determined data sequence portion 306B represents a "preamble" segment (represented by letter "P"); and pre-determined data sequence portion 306C represents a "synchronization word" segment (represented by the letters "SW"). Information portion segment 312 contains the information content of a portion of the information signal which is encoded to form a portion of slot 300.

Slots 250 and 300 are two specific examples of formats of which the more generalized slot 200 of FIG. 2 may take. Of significance is the presence of pre-determined sequences of data of which portions of the slots are comprised. As an example, preamble segments 256A and 306B of slots 250 and 300, respectively, may be comprised of a data sequence of 1001.

The gain control circuit of the preferred embodiment of the present invention utilizes the existence of predetermined data sequences, such as the example of the data sequence 1001 comprising preamble segments 256A and 306B, to determine quickly a desired amplification level of amplifier circuitry forming a portion of a radio transmitter. While the specific, pre-determined data sequence portion may vary depending upon the specific format of a particular communication system, virtually every communication system having radio transmitters operative to transmit modulated signals in discrete bursts include some form of pre-determined data forming a portion of at least one of the slots transmitted during one of the discrete bursts.

Figure 4:
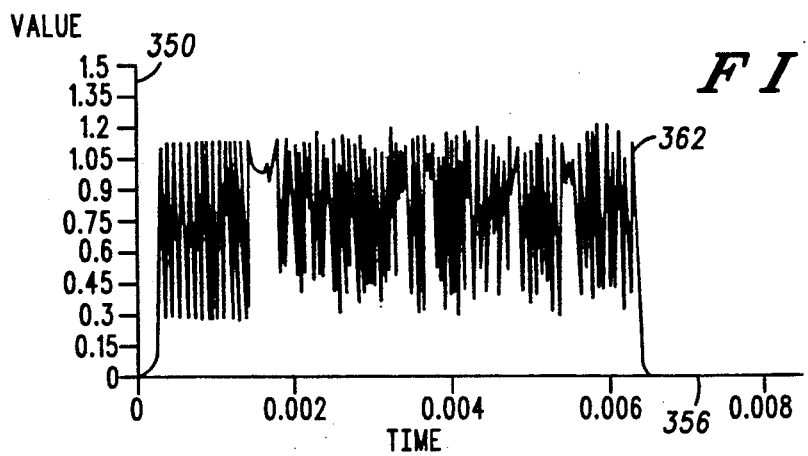
FIG. 4 is a graphical representation of the envelope of a slot formatted in a manner, and utilizing $\pi/4$-QPSK modulation, shown in the schematic representation of FIG. 3A.

FIG. 4 is a graphical representation of an envelope of waveform of a slot forming a portion of a modulated signal, such as slot 200 of FIG. 2. Ordinate axis 350 is scaled in terms of a power-related quantity, such as watts or volts, and abscissa axis 356 is scaled in terms of time, such as, for example, seconds. Envelope 362 representative of a slot, such as slot 200 of FIG. 2 is, accordingly, a plot of a power-related quantity plotted as a function of time.

Envelope 362 is representative of a π/4 DQPSK-modulated signal forming a slot having a pre-determined, data sequence portion and an information portion. The pre-determined data sequence portion, and here a sequence of 1001 modulated and encoded according to a π/4 DQPSK modulation scheme, is formed at a left-hand side portion of the envelope. Because such portion of the modulated signal portion, and hence, the envelope thereof is pre-determined, i.e., determinative, a receiver operative to receive such a modulated signal is able to detect the presence of such a data sequence.

Figure 5:
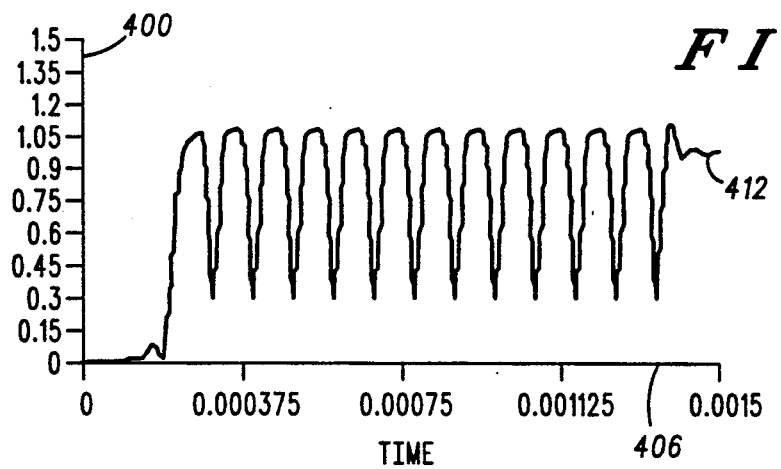
FIG. 5 is a graphical representation, similar to that of the graphical representation of FIG. 4, but illustrating, in expanded form, a portion of the envelope of FIG. 4.

The graphical representation of FIG. 5 is similar with that of FIG. 4, but with an abscissa axis expanded in scale. Accordingly, ordinate axis 400 is scaled in terms of a power-related value, and abscissa axis 406 is again scaled in terms of a time value. Envelope 412 is an expanded portion of envelope 362 of FIG. 4. In particular, envelope 412 is representative of the data sequence portion of envelope 362 of FIG. 4. Because the data sequence portion is determinative, a receiver operative to receive such a modulated signal is able to detect the presence of such a predetermined sequence of data.

A modulated signal formed of slots generated in discrete bursts is amplified by amplifier circuitry of a radio transmitter prior to transmission thereof. The amplified, modulated signal generated by the amplifier circuitry of the radio transmitter circuit may also be represented by the waveforms plotted in the graphical representations of FIGS. 4 and 5. Measurement of a power-related characteristic of such a signal is easily made by conventional circuitry, such as a diode power detector. And, the power-related characteristics of the actual, amplified, modulated signal may be compared with power-related characteristics of a desired, amplified, modulated signal as the power-related characteristics of the desired, amplified, modulated signal is determinative.

The power-related characteristic may be any envelope characteristic of the amplified, modulated signal. The envelope of the amplified, modulated signal, over time, is merely the average power of the amplified, modulated signal. Because the pre-determined, data sequence portion of a slot is determinative, the envelope of such portion of a modulated signal portion is similarly determinative. Accordingly, a peak-to-average power ratio of such an envelope may be determined, and such peak-to-average power ratio of an actual, amplified, modulated signal may be compared with the peak-to-average power ratio of a desired, amplified modulated signal.

Most simply, because the envelope of the portion of a slot comprising a pre-determined data sequence portion is determinative, a correlation may be made between an actual and a desired modulated signal level merely by detecting the peak power of an actual, amplified, modulated signal. Responsive to such correlation, the gain of the amplifier circuitry may be altered to cause amplification of the modulated signal to form an amplified, modulated signal of desired signal levels.

Figure 6:
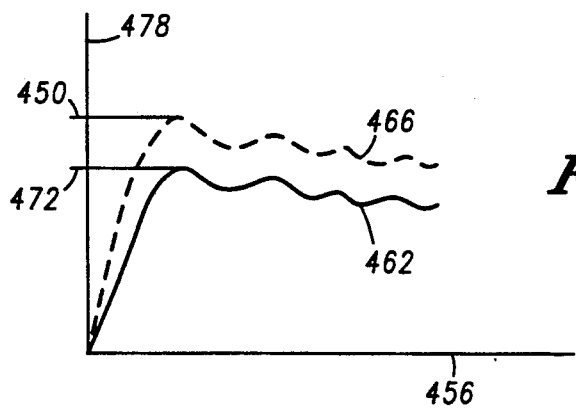
FIG. 6 is a graphical representation of an envelope amplified by amplifier circuitry and an envelope of a desired amplification level.

FIG. 6 is a graphical representation, similar with that of FIG. 4 wherein a power-related characteristic, here an instantaneous power level, scaled in terms of milliwatts on ordinate axis 478 is plotted as a function of time along abscissa axis 456. Envelope 462, plotted upon the axis system formed of axes 478 and 456 is representative of a portion of a slot comprising a pre-determined data sequence of a desired signal level. Envelope 466, shown in hatch, is representative of the envelope of a portion of a slot comprising a pre-determined data sequence of an actual, amplified, modulated signal. The peak power level of envelope 462 is indicated by point 472 on ordinate axis 478; similarly, the peak power level of envelope 466 is indicated by point 450 on ordinate axis 478. The actual and the desired peak power levels of envelopes 462 and 466, respectively, may be correlated. Responsive to such correlation, the gain characteristics of amplifier circuitry forming a portion of a radio transmitter may be altered to cause the signal generated by the amplifier circuitry to be of a signal level corresponding to a desired signal level. The graphical representation of FIG. 6 illustrates an example of which the actual, amplified, modulated signal is of power levels greater than desired. Accordingly, responsive to a correlation of the actual and desired peak power levels, the gain of amplifier circuitry of the radio transmitter circuit may be lowered.

Figure 7:
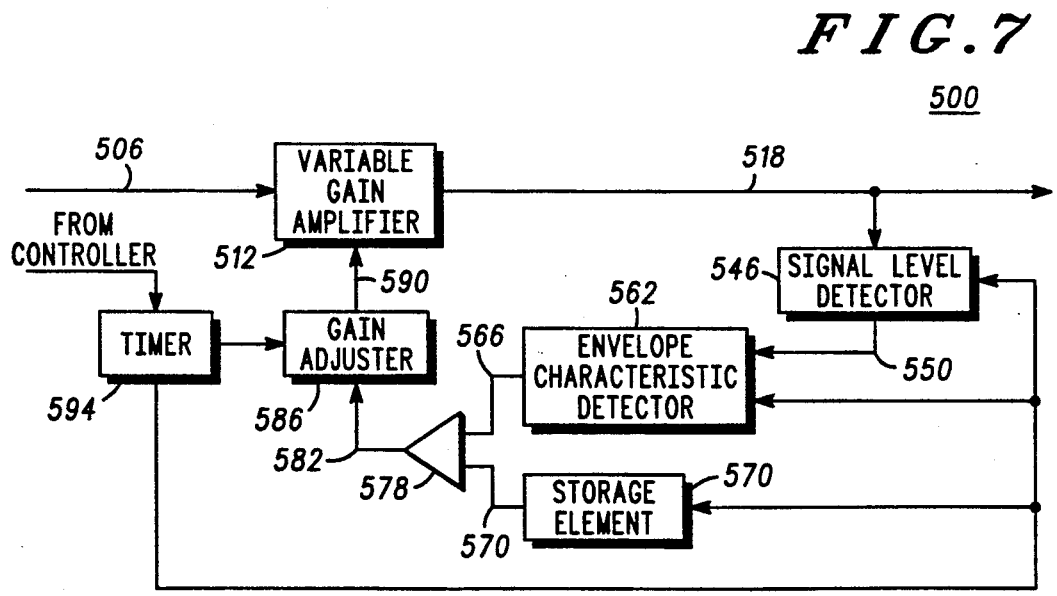
FIG. 7 is a simplified, block diagram of the gain control circuit of a first preferred embodiment of the present invention.

Turning now to the functional block diagram of FIG. 7, the gain control circuit, referred to generally by reference numeral 500, of a first preferred embodiment of the present invention is shown in functional block form. Gain control circuit 500 compares the signal level of a pre-determined data sequence portion of a first slot of a modulated signal, once amplified by a variable gain amplifier, and compares the signal level of such pre-determined data sequence portion of a slot amplified at a desired amplification level. Because the pre-determined data sequence is of a known value—i.e., signal levels of the waveform of the modulated signal portion of the slot containing the pre-determined data sequence portion actually generated can be compared with signal levels of a corresponding portion of a pre-determined data sequence portion of a slot amplified to be of a desired level. As a result of such comparison, the gain characteristics of the variable gain amplifier can be altered during transmission of the first slot.

Accordingly, a modulated signal (formed of slots generated in discrete bursts) generated on line 506 is applied to variable gain amplifier 512. Variable gain amplifier 512 amplifies the modulated signal applied thereto, and generates an amplified, modulated signal on line 518.

Signal level detector 546 is coupled to receive the amplified, modulated signal generated on line 518, and is operative to generate a signal on line 550 responsive to detected, power-related levels of the amplified, modulated signal generated on line 518. The signal generated on line 550 is applied to envelope characteristic detector 562. Detector 562 is operative to detect a power-related characteristic responsive to the signal level of the signal applied thereto on line 550. In a preferred embodiment, detector 562 is operative to detect the peak power level of a pre-determined data sequence portion of a first slot of the modulated signal. Envelope characteristic detector 562 generates a signal on line 566 indicative of such detected value.

Storage element 570 stores a value of a desired power-related characteristic of a slot amplified at a desired amplification level. The characteristic corresponds with the characteristic detected by detector 562. A signal representative of such value generated on line 574 is applied to comparator 578. The signal generated by envelope characteristic detector 562 on line 566 is also applied to comparator 578.

Comparator 578 compares the values of the signals applied thereto on lines 566 and 574 and generates a comparison signal on line 582 responsive to the comparison therebetween. Line 582 is coupled to gain adjuster 586 which is operative to generate a signal on line 590 which, in turn, is applied to variable gain amplifier 512. The signal applied to variable gain amplifier 512 on line 590 alters the gain characteristics thereof. The signal generated by gain adjuster 586 on line 590 is operative to increase or decrease, or to cause to remain constant, the gain characteristics of amplifier 512.

Timer element 594 is further illustrated in the functional block diagram of FIG. 7, and is shown to be coupled to signal level detector 546, envelope characteristic detector 562, storage element 570, and gain adjuster 586. Timer 594 is operative to generate a signal to cause operation of detectors 546 and 562, and to cause storage element 570 to generate a signal on line 574, during times in which the pre-determined data sequence portion of a modulated signal portion is generated on line 506, and, hence, thereafter on line 518 to cause operation of detectors 546 and 562, storage element 570, and gain adjuster 586 during times in which the pre-determined data sequence is generated on line 506.

Figure 8:
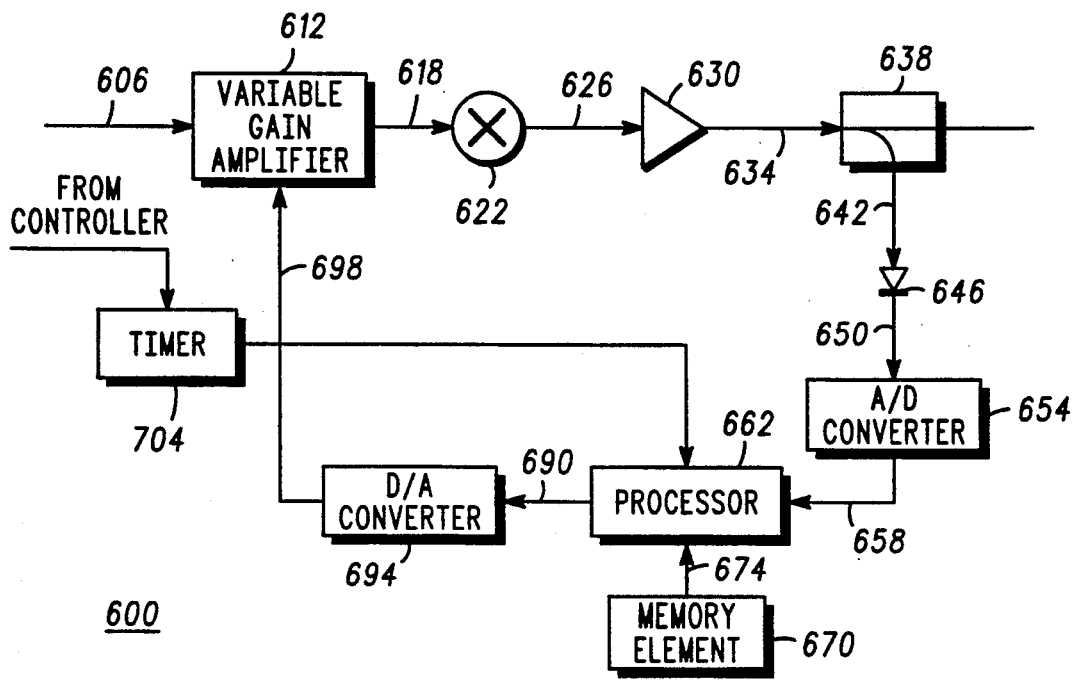
FIG. 8 is a block diagram of the gain control circuit of a second preferred embodiment of the present invention.

Turning now to the block diagram of FIG. 8, the gain control circuit, referred to generally by reference numeral 600, of a preferred embodiment of the present invention is shown. Again, a modulated signal generated by modulation circuitry of a radio transmitter, and formed of slots generated in discrete bursts, is applied to variable gain amplifier circuitry. Here, the modulated signal is generated on line 606, and applied to variable gain amplifier 612.

Variable gain amplifier 612 generates an amplified, modulated signal on line 618 which, here, is applied to mixer circuit 622. While not shown, an oscillating signal of a desired up-mixing, oscillating frequency is additionally applied to mixer circuit 622. Mixer circuit 622 generates an up-mixed signal on line 626 which is applied to power amplifier 630. Power amplifier 630 is operative to amplify further the signal applied thereto. Power amplifier 630 generates a signal on line 634 which is applied to directional coupler 638.

Line 642 is coupled at a first side thereof to a first line of directional coupler 638, and, at a second side thereof, to a signal level detector, here diode power detector 646. Diode 646 is operative to detect the power levels of the signal generated on line 634 and to generate a signal indicative of such detected power level on line 650.

Line 650 is coupled to analog-to-digital converter 654 which generates a digitized signal on line 658 which is applied to processor 662. Processor 662 contains algorithms operative to perform the functions of envelope characteristic detector 562, comparator 578, and gain adjuster 586 of gain control circuit 500 of FIG. 7.

Memory element 670 stores values representative of a desired power-related characteristic, again, preferably, a peak power level as noted hereinabove, and is coupled to processor 662 by way of line 674. Processor 662 is operative to determine a level of an actual, measured power-related characteristic measured by diode 646 with a value stored by memory element 670. Processor 662 further correlates the two values, and generates a gain adjustment signal responsive to such correlation on line 690. The gain adjustment signal generated on line 690 is applied to digital-to-analog converter 694, and an analog signal is generated on line 698. Line 698 is coupled to variable gain amplifier 612 to alter the gain characteristic of the amplifier responsive to the signal level of the signal applied thereto on line 698.

Timer 704 is further illustrated in the block diagram of FIG. 8, and is coupled to processor 662 to cause operation of the necessary algorithms embodied within the processor during times in which the slots forming the modulated signal generated on line 606 (and, thereafter, the signal generated on line 634) comprises a pre-determined data sequence. Because the gain control circuit 600 needs only to detect a peak power level of a pre-determined data sequence to determine the desired gain characteristics of variable gain amplifier 612, gain control circuit 600 is able to determine quite quickly the desired gain characteristics of the amplifier 612.

Figure 9:
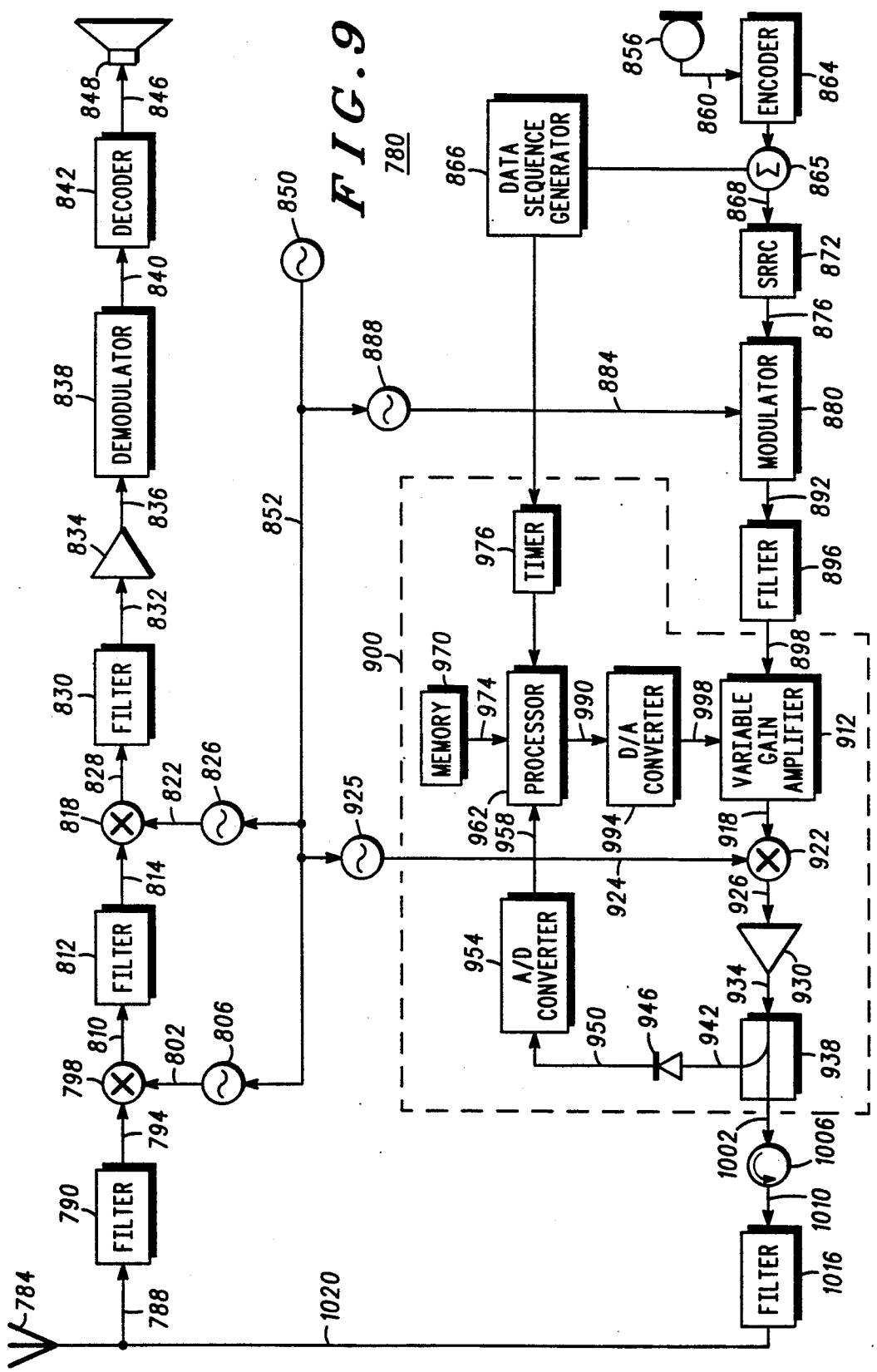
FIG. 9 is a block diagram of a radio transceiver of a preferred embodiment of the present invention which includes the gain control circuit of FIG. 8.

Turning now to the block diagram of FIG. 9, a radio-telephone, referred to generally by reference numeral 780, of a preferred embodiment of the present invention is shown. Radiotelephone 780 is a radio transceiver having a receiver portion and a transmitter portion wherein the transmitter portion includes the gain control circuit shown in FIGS. 7–8.

The top-half portion of the block diagram of radiotelephone 780 represents the receiver portion of the radiotelephone, and the bottom-half portion of the block diagram represents the transmitter portion of the radiotelephone.

The radio receiver portion of radiotelephone 780 is operative to receive a modulated signal transmitted thereto. Antenna 784 is operative to receive the modulated signal transmitted thereto. Antenna 784 converts the received signal into electrical form and generates an electrical signal indicative of the received signal on line 788. Line 788 is coupled to filter 790 which generates a filtered signal on line 794. Line 794 is coupled to a first input of down-mixer 798 to supply an oscillating signal generated by local oscillator 806 to down-mixer 798.

Down-mixer 798 generates a down-mixed signal on line 810 which is applied to filter 812. Filter 812 generates a filtered signal on line 814 which is applied to a first input of second down-mixer 818 to supply an oscillating signal generated by local oscillator 826 to down-mixer 828.

Down-mixer 818 generates a second down-mixed signal on line 828 which is applied to filter 830. Filter 830 generates a filtered signal on line 832 which is applied to amplifier 834. Amplifier 834 generates an amplified signal on line 836 which is applied to demodulator 838.

Demodulator 838 generates a demodulated signal on line 840 which is applied to decoder 842. Decoder 842 generates a decoded signal on line 846 which is applied to a transducer, here speaker 848.

The oscillating frequency of the oscillating signal generated by oscillators 806 and 826 are maintained in a known frequency relationship with reference oscillator 850 by their respective connections to oscillator 850 by way of line 852.

The transmitter portion of radiotelephone 780 is shown at the bottom-half portion of the figure. An information signal, for instance a voice signal, is converted by a transducer, here microphone 856, into electrical form, and an electrical signal indicative of such information signal is generated on line 860. Line 860 is coupled to encoder 864 which encodes the information signal applied thereto according to an encoding scheme, such as a π/4, QPSK encoding scheme. Encoder 864 generates an encoded signal which is applied to an input of summing element 865.

Data sequence generator 866 generates a signal which is also applied to an input to summer 865. Summer 865 is operative to combine the signals applied thereto in desired sequences to form the format of a slot, such as those illustrated in FIGS. 2 and 3A-3B. Summing element 865 generates a signal on line 868 which is applied to filter 872, here a square root raised cosine (SRRC) filter.

Filter 872 generates a filtered signal on line 876 which is applied to modulator 880. Modulator 880 also receives an oscillating signal on line 884 generated by oscillator 888. Modulator 880 generates a modulated signal on line 892 which is applied to filter 896. Filter 896 generates a filtered signal on line 898 which is applied to gain control circuit 900, represented by the block shown in hatch. Gain control circuit 900 is similar to gain control circuit 600 of FIG. 8.

Similar to gain control circuit 600, gain control circuit 900 is comprised of variable gain amplifier 912, which generates a signal on line 918 which is coupled to mixer 922. Line 924 is also coupled to mixer 922 to supply an oscillating signal generated by oscillator 925 to the mixer. Mixer 922 generates an up-mixed signal on line 926 which is applied to power amplifier 930. Power amplifier 930 generates a signal on line 934 which is applied to directional coupler 938.

Line 942 is coupled at a first side thereof to a line of coupler 938, and is coupled at a second side thereof to diode peak detector 946.

Diode peak detector 946 generates a signal on line 950 which is applied to analog-to-digital converter 954. Converter 954 generates a digitized signal on line 958 which is applied to processor 962. Memory element 970 is coupled to processor 962 by way of line 974.

Timer 976 further forms a portion of gain control circuit 900, and is coupled to processor 962 and to data sequence generator 866 to cause operation of the necessary algorithms embodied within the processor during times in which the slots forming the modulated signal generated on line 898 comprises a pre-determined data sequence.

Processor 962 generates a signal on line 990 which is applied to digital-to-analog converter 994. Converter 994 generates an analog signal on line 998 which, in turn, is coupled to variable gain amplifier 912 to control the gain characteristics thereof.

Operation of gain control circuit 900 is similar with that of gain control circuit 700 of FIG. 8, and operation thereof will therefore not be described again in detail.

Radiotelephone 780 of FIG. 9 is further shown to include line 1002 having a first side thereof coupled to directional coupler 938, and a second side thereof coupled to isolator 1006. Isolator 1006 generates a signal on line 1010 which is applied to filter 1016, and filter 1016 generates a filtered signal on line 1020. Line 1020 is coupled to antenna 784 permitting transmission by the antenna of the signal applied thereto.

Figure 10:
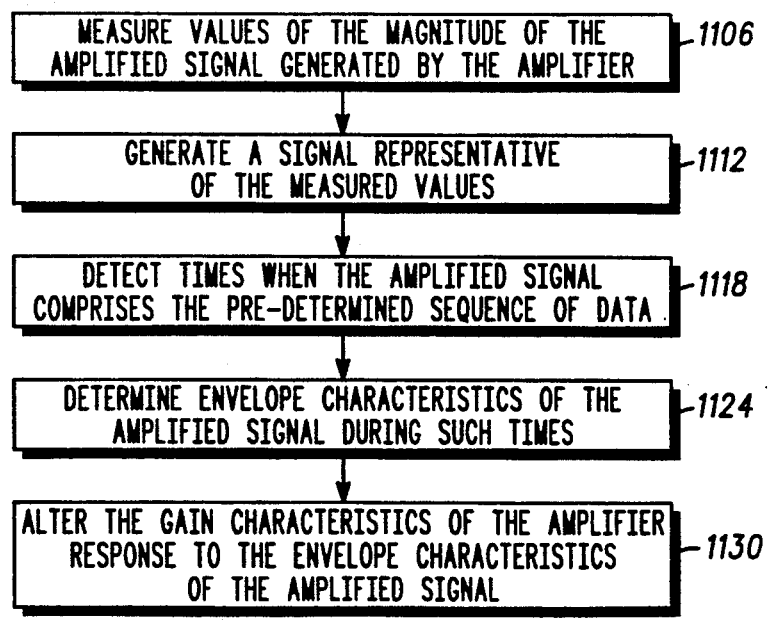
FIG. 10 is a logical flow diagram listing the method steps of a method of a preferred embodiment of the present invention.

Turning finally now to the logical flow diagram of FIG. 10, the method steps of a preferred embodiment of the method, referred to generally by reference numeral 1100, of a preferred embodiment of the present invention are listed.

First, and as indicated by block 1106, method 1100 of the preferred embodiment of the present invention comprises the steps of measuring values of the magnitude of the amplified signal generated by a variable gain amplifier circuit.

Next, and as indicated by block 1112, a signal representative of measured values of the magnitude of the amplified signal measured during the step of measuring is generated.

Next, and as indicated by block 1118, times when the amplified signal generated by the variable gain amplifier circuit comprises the predetermined sequence of data are detected.

Next, and as indicated by block 1124, envelope characteristics of the amplified signal are determined.

Finally, and as indicated by block 1130, the gain characteristics of the variable gain amplifier are altered responsive to values of the envelope characteristics of the amplified signal determined during the step of determining.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A gain control circuit for a radio transmitter having a variable gain amplifier forming a portion thereof, the radio transmitter being operative to generate an information signal in discrete bursts wherein the information signal generated during at least one of the discrete bursts includes a pre-determined sequence of data, and the variable gain amplifier circuit forming the portion of the transmitter circuitry of the radio transmitter operative to form an amplified signal in discrete bursts corresponding to the discrete bursts in which the information signal is generated, said gain control circuit comprising:

means, coupled to receive a signal indicative of the amplified signal formed by the variable gain amplifier circuit, for measuring values of the magnitude of the amplified signal and for generating a detected-power level signal representative of measured values of the magnitude of the amplified signal measured thereat;

means, coupled to receive the detected-power level signal generated by said means for measuring, for detecting times when the amplified signal formed by the variable gain amplifier circuit comprises the pre-determined sequence of data;

means, operative at least during times when the detected-power level signal generated by the means for measuring and representative of the amplified signal comprises the pre-determined sequence of data, for determining envelope characteristics of the detected-power level signal; and means, operative responsive to values of the envelope characteristics of the detected-power level signal determined by said means for determining, for altering the gain characteristics of the variable gain amplifier.

2. The gain control circuit of claim 1 wherein said means for measuring values comprises a diode-peak detector.

3. The gain control circuit of claim 1 wherein said means for measuring values of the magnitude of the amplified signal comprises means for measuring instantaneous, power-related values of the amplified signal.

4. The gain control circuit of claim 3 wherein said power-related values comprise voltage values.

5. The gain control circuit of claim 1 wherein said means for detecting comprises a timer controller operative to monitor times when the information signal is comprised of the pre-determined sequence of data.

6. The gain control circuit of claim 1 wherein said means for determining envelope characteristics comprises means for. determining a peak-to-average power ratio of the detected-power level signal.

7. The gain control circuit of claim 6 wherein said means for determining a peak-to-average power ratio comprises: means for determining a peak power value of the detected-power level signal comprised of the pre-determined sequence of data; and means for correlating the peak power value with a peak power value associated with a desired peak-to-average power ratio of the detected-power level signal.

8. The gain control circuit of claim 7 wherein said means for correlating further comprises a memory element for storing the peak power value associated with the desired peak-to-average power ratio of the detected-power level signal.

9. The gain control circuit of claim 8 wherein said means for altering the gain characteristics of the variable gain amplifier alters the gain characteristics thereof responsive to levels of the peak power value determined by the means for determining the peak power value of the detected-power level signal relative to levels of the desired peak-to-average power ratio.

10. The gain control circuit of claim 1 wherein said means for altering the gain characteristics of the variable gain amplifier generates an amplification control signal for application to the variable gain amplifier to control the gain characteristics of the variable gain amplifier.

11. A gain control circuit for a radiotelephone having transmitter circuitry including a modulator for modulating an information signal during selected time periods according to a QPSK-modulation scheme thereby to form a QPSK-modulated signal during the selected time periods, the information signal having, at least during a first time period of the selected time periods, a pre-determined sequence of data forming a modulated, pre-determined sequence portion of the QPSK-modulated signal, and a variable gain amplifier circuit coupled to receive the QPSK-modulated signal and operative to form an amplified, QPSK-modulated signal, the radio transmitter being operative to transmit the amplified, QPSK-modulated signal in discrete bursts, the discrete bursts corresponding to the selected time periods during which the modulator generates the QPSK-modulated signal, said gain control circuit comprising:

a diode power detector coupled to receive the amplified, QPSK-modulated signal generated by the variable gain amplifier circuit, said diode power detector operative to measure values of the magnitude of the amplified, QPSK-modulated signal and for generating signals representative of measured values of the magnitude of the amplified, QPSK-modulated signal;

a processor circuit coupled to receive the signals generated by the diode power detector and having an algorithm embodied therein for: 1. determining times when the discrete burst of the QPSK-modulated signal includes the modulated, pre-determined sequence portion; 2. determining a peak power level of the modulated, pre-determined sequence portion; 3. correlating the peak power level of the modulated, pre-determined sequence portion with a peak power level associated with a modulated, pre-determined sequence of a desired amplification level; and 4. determining a desired amplification level of the variable gain amplifier responsive to correlations between the peak power level of the modulated, pre-determined sequence of the desired amplification level; and means for altering the gain characteristics of the variable gain amplifier responsive to the desired amplification level of the variable gain amplifier determined by the processor circuit.

12. In a radio transmitter having transmitter circuitry including a variable gain amplifier circuit forming a portion thereof, the radio transmitter being operative to generate an information signal in discrete bursts wherein the information signal generated during at least one of the discrete bursts includes a pre-determined sequence of data, and the variable gain amplifier circuit forming a portion of the transmitter circuitry of the radio transmitter operative to form an amplified signal in discrete bursts corresponding to the discrete bursts in which the information signal is generated, a combination with the variable gain amplifier of a gain control circuit, said gain control circuit comprising:

- means, coupled to receive signals indicative of amplified signal formed by the variable gain amplifier circuit, for measuring values of the magnitude of the amplified signal and for generating a detected-power level signal representative of measured values of the magnitude of the amplified signal measured thereat;
- means, coupled to receive the detected-power level signal generated by said means for measuring, for detecting times when the amplified signal formed by the variable gain amplifier circuit comprises the pre-determined sequence of data;
- means, operative at least during times when the detected-power level signal generated by the means for measuring and representative of the amplified signal comprises the pre-determined sequence of data, for determining envelope characteristics of the detected-power level signal; and
- means, operative responsive to values of the envelope characteristics of the detected-power level signal determined by said means for determining, for altering the gain characteristics of the variable gain amplifier.

13. A method for controlling gain characteristics of a variable gain amplifier forming a portion of a radio transmitter operative to transmit an information signal in discrete bursts wherein the information signal generated during at least one of the discrete bursts includes a pre-determined sequence of data, the variable gain amplifier operative to form an amplified signal in discrete bursts corresponding to the discrete bursts in which the information signal is generated, said method comprising the steps of:

- measuring values of the magnitude of the amplified signal generated by the variable gain amplifier circuit;
- generating a detected-power level signal representative of measured values of the magnitude of the amplified signal measured during said step of measuring;
- detecting times when the detected-power level signal generated during said step of generating the detected-power level signal comprises the pre-determined sequence of data;
- determining envelope characteristics of the detected-power level signal at least during times when the detected-power level signal generated during the step of generating the detected-power level signal comprises the pre-determined sequence of data; and
- altering the gain characteristics of the variable gain amplifier responsive to values of the envelope characteristics of the detected-power level signal determined during said step of determining.

14. The method of claim 13 wherein said step of measuring comprises measuring instantaneous, power-related values of the amplified signal.

15. The method of claim 14 wherein the instantaneous power related values measured during said step of measuring comprise voltage values.

16. The method of claim 13 wherein said step of determining envelope characteristics comprises determining a peak-to-average power ratio of the detected-power level signal.

17. The method of claim 16 wherein said step of determining the peak-to-average power ratio comprises the steps of: determining a peak power value of the detected-power level signal comprised of the pre-determined sequence of data; and correlating the peak power value with a peak power value associated with a desired peak-to-average power ratio of the detected-power level signal.

18. The method of claim 17 wherein the step of correlating comprises the steps of storing the peak power value associated with the desired, peak-to-average power ratio in a memory element to form a stored value thereby and comparing the stored value with the peak power value of the detected-power level signal.

19. The method of claim 18 wherein said step of altering the gain characteristics of the variable gain amplifier comprises the step of altering the gain characteristics responsive to levels of the peak power value determined during said step of determining the peak power value of the detected-power level signal relative to levels of the desired peak-to-average power ratio.

20. The method of claim 13 wherein said step of altering comprises the further step of: generating an amplification control signal for application to the variable gain amplifier to control the gain characteristics of the variable gain amplifier.

* * * * *